United States Patent [19]

Yamaguchi et al.

[11] Patent Number: 5,305,225

[45] Date of Patent: Apr. 19, 1994

[54] CHARGED PARTICLE LITOGRAPHY METHOD AND APPARATUS

[75] Inventors: Toshio Yamaguchi, Tokyo; Satoshi Yamasaki, Yokohama; Takayuki Abe, Kawasaki, all of Japan

[73] Assignee: Kabushiki Kaisha Toshiba, Kawasaki, Japan

[21] Appl. No.: 876,426

[22] Filed: Apr. 30, 1992

[30] Foreign Application Priority Data

Apr. 30, 1991 [JP] Japan ................................. 3-99161

[51] Int. Cl.[5] ...................... G06F 15/46; H01J 37/304
[52] U.S. Cl. ............................. 364/474.02; 250/398; 250/492.3; 250/492.2
[58] Field of Search ........................ 364/474.02, 490; 250/492.2, 492.22, 492.3, 398, 492.24; 156/654

[56] References Cited

U.S. PATENT DOCUMENTS

| | | | |
|---|---|---|---|
| 4,943,729 | 7/1990 | Ando et al. | 250/492.3 |
| 5,008,553 | 4/1991 | Abe | 250/492.2 |
| 5,051,598 | 9/1991 | Ashton et al. | 250/492.2 |
| 5,135,609 | 8/1992 | Pease et al. | 156/654 |
| 5,189,306 | 2/1993 | Frei | 250/492.2 |

FOREIGN PATENT DOCUMENTS

63-8608 2/1988 Japan .

OTHER PUBLICATIONS

Japanese Journal of Applied Physics; vol. 30, No. 3B; Mar., 1991: pp. L528-L531; Takayuki Abe, et al.; "Representative Figure Method for Proximity Effect Correction".

Journal of Applied Physics, vol. 50(6); Jun., 1979; pp. 4371-4387; Mihir Parikh; "Corrections to Proximity Effects in Electron Beam Lithography".

Journal of Applied Physics, vol. 65(11), Jun. 1, 1989; pp. 4428-4434; Takayuki Abe, et al. "Proximity Effect Correction For High-Voltage Electron Beam Lithography".

Journal of Vacuum Science Technology, vol. B4(1), Jan./Feb. 1986; pp. 159-163; J. M. Pavkovich; "Proximity Effect Correction Calculations by the Integral Equation Approximate Solution Method".

Primary Examiner—Jerry Smith
Assistant Examiner—Jim Trammell
Attorney, Agent, or Firm—Oblon, Spivak, McClelland, Maier & Neustadt

[57] ABSTRACT

In an electron beam lithography method which irradiates a sample with an electron beam to draw a desired pattern on the sample, figure data representing the shape of an elemental figure, placement data representing placement information of the figure data, and dose data representing dose for each of areas which are obtained by dividing a drawing area which are smaller than the broadening of backscattering of an electron beam are independently stored in a memory as drawing data. On the basis of the drawing data, the figure data is divided into unit figures each of which has a predetermined shape and is smaller than a predetermined size. A represented point of each unit figure is calculated, a dose of an electron beam is obtained from the data set for an area in which the represented point is present, and the quantity of radiation is determined as dose for the unit figure.

9 Claims, 10 Drawing Sheets

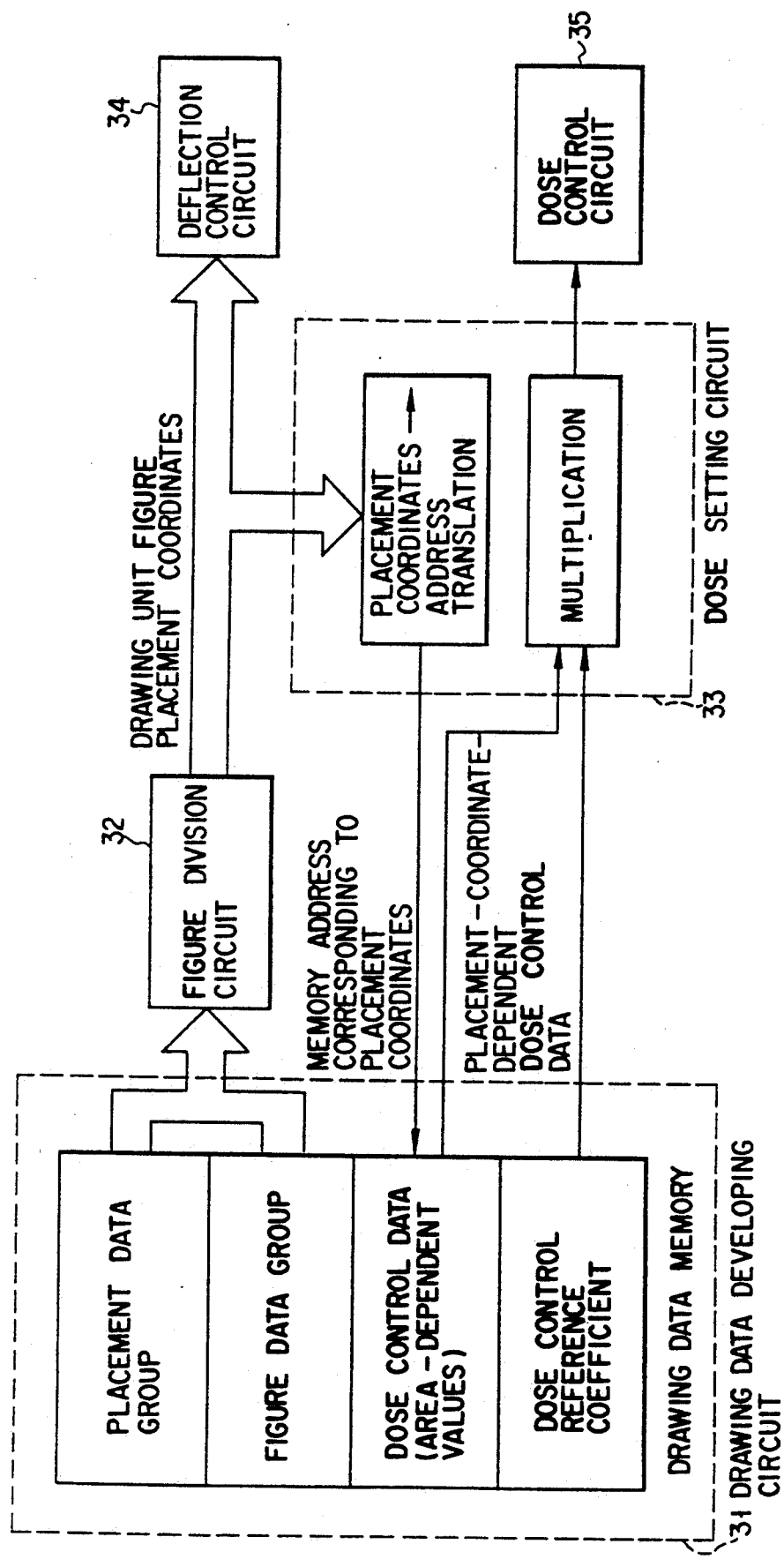
F I G. 6

5,305,225

CHARGED PARTICLE LITOGRAPHY METHOD AND APPARATUS

BACKGROUND OF THE INVENTION

1. Field of the Invention

The present invention relates to apparatus for and methods of drawing patterns using a charged particle beam. More specifically, the present invention relates to charged particle beam lithography apparatus and methods which make dose corrections in drawing patterns by the use of a charged particle beam.

2. Description of the Related Art

With conventional electron beam lithography apparatus employing a variable shaped electron beam, dose is controlled to make corrections to pattern proximity effects. With the conventional apparatus, in order to reduce the time required to transfer pattern drawing data from an external storage unit to a drawing control circuit and to save the resource of an internal storage unit, pattern drawing data is compressed by a method using such a data structure as described below.

Consider a case where group patterns 60, each composed of two elemental FIGS. 61 and 62, are arrayed in four rows and four columns as shown in FIG. 1. Drawing data is represented, as shown in FIG. 2, by a placement data group, a figure data group, and a dose control data group.

The figure data group contains a group of group patterns each of which is a collection of elemental figures each constructing a certain pattern. The figure data is a set of data describing the code which means a kind of figure, the irradiation position ($X_m$, $Y_m$), and the size ($H_m$, $W_m$) of each of elemental figures constructing a desired pattern.

The placement data group is placement information of the group patterns. The placement data for a group pattern i comprises a set of data on the positions ($X_{xi}$, $Y_{yi}$) of a reference point of placement, the repetition counts $N_{xi}$, $N_{yi}$ (in the example of FIG. 1, $N_{xi}=N_{yi}=4$) of the group pattern, the repetition pitches $P_{xi}$, $P_{yi}$ of the group pattern, the number $N_i$ of elemental figures in the group pattern, the starting address PFi of the storage area storing the figure data, and the starting address PDi of the storage area storing dose control data for the figure data.

The dose control data group is a set of data describing the dose $t_m$ of each unit figure.

In the case where one group pattern is arranged repeatedly, the definition of figure data representing the group pattern, group pattern placement data, and dose control data for the figure data will be adequate. Thus, the use of the above method will permit compression of pattern drawing data.

With the above method, if the size of an elemental figure is larger than the broadening of the backscattering of an irradiation electron beam, the original elemental figure must be subdivided into elemental figures each of which is much smaller than the broadening of the backscattering, and dose control data must be described for each of the subdivided elemental figures. This will be described with reference to FIGS. 3A through 3C.

When, as shown in FIG. 3a, an electron beam falls on a point of irradiation 81, i.e., a point O, the range 81 of the distribution of backscattered electron will be within a circle with a radius of $\sigma(=3\sigma_b)$ and with a center at the point O, where $\sigma_b$ represents the broadening of the backscattering. If, as shown in FIG. 3B, an another desired elemental FIG. 83 were drawn, with its dose controlled, within the circle 82, the total dose would differ from a predetermined amount. In order to perform drawing with the total dose controlled, it is necessary that, as shown in FIG. 3C, a unit FIG. 84 is much smaller than the circle, and the dose for the unit FIG. 84 is controlled taking into account the dose by backscattering caused in drawing other elemental figures within the circle 82.

As described above, when the size of an elemental figure constructing a pattern is large, the compression of drawing data, which is possible with the conventional method, is impossible and moreover an increase in the quantity of drawing data results. That is, a problem with the conventional method is that the compression of drawing data is insufficient in making dose corrections. In addition, insufficient data compression by the conventional method will make data transfer time long, decrease the operating ratio of an electron beam lithography apparatus and in its turn decrease its drawing throughput.

As described above, the conventional method of compression of drawing data cannot attain sufficient data compression in making corrections to proximity effect. Thus, the drawing data transfer time inevitably becomes long, which reduces the operating ratio of the charged particle beam drawing apparatus.

Techniques related to the present invention include T. Abe et al., "Representative Figure Method for Proximity Effect Correction," Japanese Journal of Applied Physics, Vo. 30, No. 3B, March, 1991, pp. 258-351, M. Parikh, "Correction to Proximity Effects in Electron Beam Lithography (I. Theory; pp. 4371, II. Implementation; pp. 4378 and III. Experiments; pp. 4383)," J. Appl. Phys. 50(6). June 1979, Y. Machida et al., Japanese Examined Publication, Feb. 23, 1988, T. Abe et al., "Proximity effect correction for high-voltage electron beam lithography," J. Appl. Phys. 65(11), 1 June 1989, and J. M. Pavkovich, "Proximity effect correction calculation by the integral equation approximate solution method," J. Vac. Technol. B4(1), January/February 1986.

SUMMARY OF THE INVENTION

It is an object of the present invention to provide a charged particle beam lithography method which permits efficient compression and expansion of drawing data in drawing elemental figures with dose varied for corrections to proximity effect and permits improvements in the operating ratio and drawing throughput of lithography apparatus to be made.

It is another object of the present invention to provide a charged particle beam lithography apparatus which carries out the method.

The features of the present invention are separation of figure data, placement data and dose data contained in drawing data, division of a drawing area into areas smaller than the broadening of backscattering of a charged particle beam, and setting of dose for each of the small areas, thereby avoiding subdivision of an elemental figure due to proximity effect correction, checking an increase in drawing data quantity and reducing an increase in drawing data transfer time.

The charged particle lithography method of the present invention processes drawing data so as to satisfy the following eight points:

(1) A desired pattern is constructed from elemental figures, and figure data is set to represent the shape of the unit figures.

(2) Placement data is set to represent placement information of the figure data.

(3) At least a part of a drawing area is divided into areas much smaller than the broadening of backscattering of a charged particle beam, and data is set to calculate dose for each of the small areas.

(4) The data sets in (1), (2), (3) are described independently.

(5) The figure data in (1) is divided into unit figures each of which has a predetermined shape and is smaller than a predetermined size.

(6) A representative point is calculated for each of the unit figures.

(7) The area of (3) in which the representative point of (6) is present is obtained.

(8) A dose of a charged particle beam is calculated from data set for the area, and this is determined as dose for the unit figure.

The charged particle beam lithography apparatus of the present invention which draws a desired pattern on the basis of drawing data defined by (1) to (4) has the following five functions:

(1) A function of generating a unit figure from the figure data in the drawing data.

(2) A function of determining the drawing position of the unit figure from the placement data in the drawing data.

(3) A function of determining a represented point of the unit figure from the size of the unit figure and coordinates of the represented point of the unit figure from the placement data.

(4) A function of determining dose for the unit figure from the coordinates of the represented point of the unit figure determined by (3) and the dose control data in the drawing data.

(5) A function of realizing the functions (1) to (4) and drawing the unit figure.

The basis of the present invention is that, even if a drawing area is divided into areas smaller than backscattering and the dose is set only one for figures within each of the small areas, the accuracy of proximity effect correction suffers no considerable deterioration. The validity of the basis of the present invention will be discussed below.

When a charged particle beam, for example, an electron beam, falls on a point $[X]'$ on a resist with a quantity of radiation $d([X]')$, the dose $E([X])$ of the resist at a point $[X]$ is represented by:

$$E([X]) = \qquad (1)$$

$$d \times \left\{ \delta([X] - [X]') + \eta_e \frac{\sigma_f^2}{\sigma_b^2} \exp(-([X] - [X]')^2/\sigma_b^2) \right\}$$

where $\eta_e$ is the ratio of dose due to forward scattering to dose due to backscattering, $\sigma_b$ is the broadening of backscattering, and $\sigma_f$ is the broadening of forward scattering. $[X]$ represents a vector (same as hereinafter). The first term within braces indicates dose due to irradiation with the electron beam and the second term indicates dose due to backscattering. The proximity effect depends mainly on the second term based on backscattering. In the following, therefore, the consideration is based on the second term.

The effect of backscattering when an electron beam falls on the point X will be given by:

$$d([X]) \times \eta_e \frac{\sigma_f^2}{\sigma_b^2} \qquad (2)$$

When an electron beam falls on a point at a very short distance of $[\Delta]$ from the point $[X]$, the effect of backscattering at the point $[X]$ will be:

$$d([X]) \times \eta_e \frac{\sigma_f^2}{\sigma_b^2} \exp(-|[\Delta]|^2/\sigma_b^2) \qquad (3)$$

From expressions (2) and (3) it will be seen that the variation of dose caused by falling of the electron beam on the point $[X]+[\Delta]$ in place of the point $[X]$ is in the order of $$\frac{\frac{d([X]) \times \eta_e \times \sigma_f^2}{\sigma_b^2} \{1 - \exp(-|[\Delta]|^2/\sigma_b^2)\}}{d([X]) \times \eta_e \frac{\sigma_f^2}{\sigma_b^2}} \sim \frac{|[\Delta]|^2}{\sigma_b^2} \qquad (4)$$

The error caused by dose of the point $[X]+[\Delta]$ with the optimum dose $d([X])$ for the point $[X]$ in place of the optimum dose $d([X]+[\Delta])$ for the point $[X]+[\Delta]$ is substantially the same as the error indicated by expression (4). For example, assuming $|[\Delta]|$ to be $\sigma_b/5$, the error is as small as 4%. In the case of an accelerating voltage of 50 kV, since $\sigma_b=10 \mu m$, $2 \mu m \times 2 \mu m$ will be sufficient for the size of a small area.

The present invention enables setting of dose for each of small areas, independently of the shape and size of an elemental figure to be drawn. The use of the present invention eliminates the need of division of an elemental figure for dose setting caused by proximity effect correction. For this reason, an increase in the number of elemental figures is checked, decreasing data quantity, thereby reducing the data transfer time to a large extent.

According to the present invention, as described above, the figure data, the placement data, and the dose data, contained in drawing data, are separated, a drawing area is divided into areas smaller than the broadening of backscattering of a charged particle beam, and dose is set for each of the small areas. According to the present invention, therefore, since efficient compression and expansion of drawing data is made possible in drawing patterns with dose controlled for proximity effect correction, the operating ratio and the drawing throughput of the lithography apparatus can be improved.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 6 is a block diagram of a drawing controller for use in the first embodiment;

DETAILED DESCRIPTION OF THE PREFERRED EMBODIMENTS

Referring to the accompanying drawings, embodiments of the present invention will be explained.

Figures 1A, 1B:
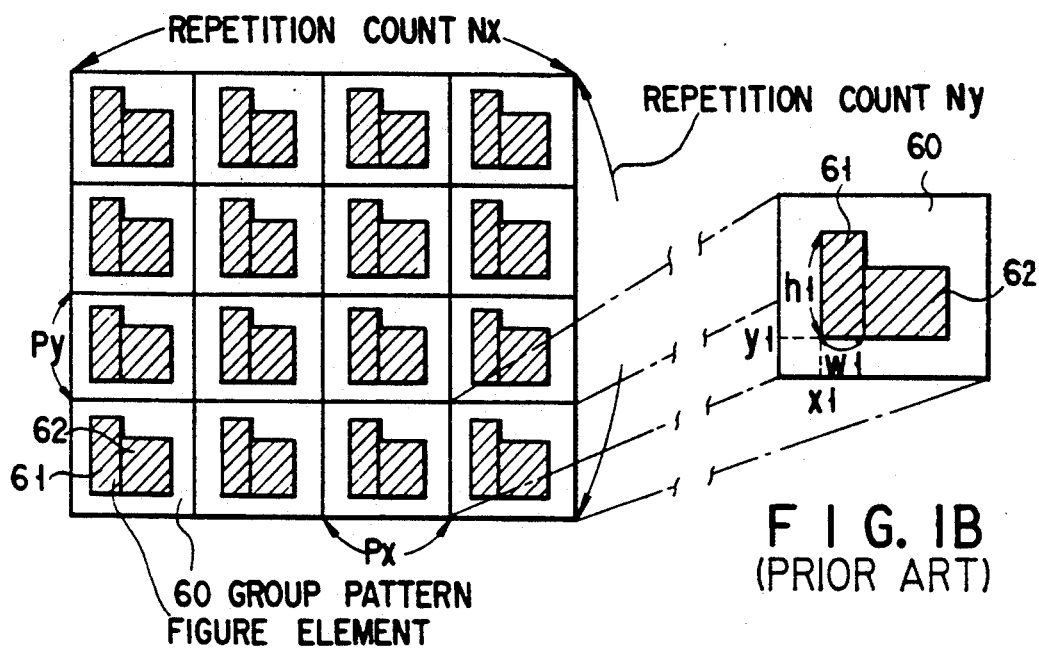
FIG. 1a and 1b are examples of a pattern placement of compressed construction on a conventional system.
Figure 2:
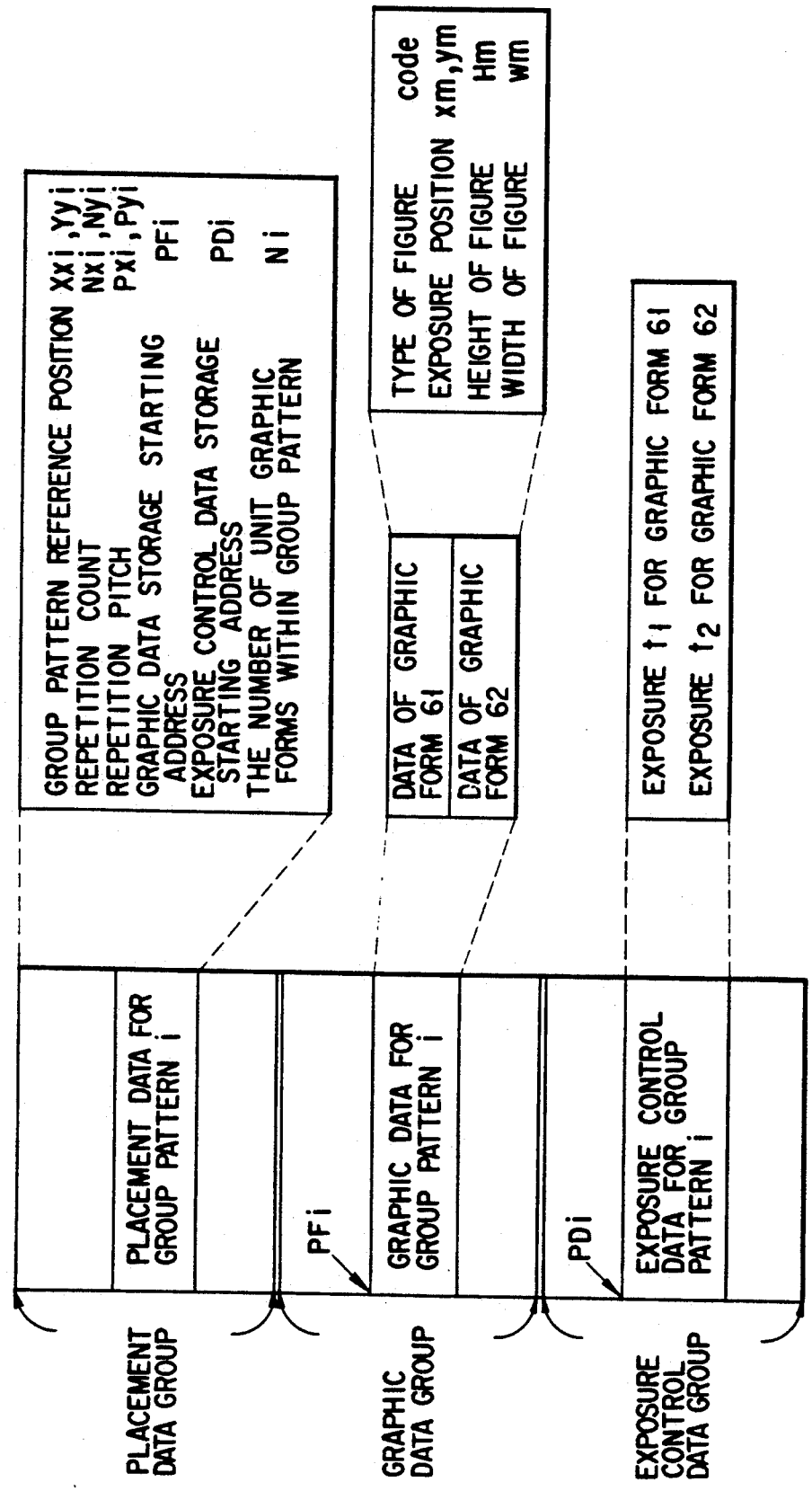
FIG. 2 is a diagrammatic representation of a construction of compressed data based on the conventional system.
Figure 3A:
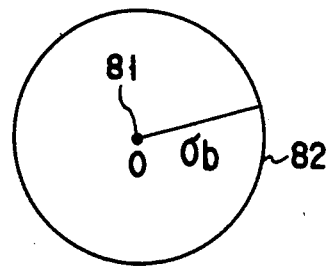
FIGS. 3A through 3C are diagrams illustrating problems with the conventional system.
Figure 3B:
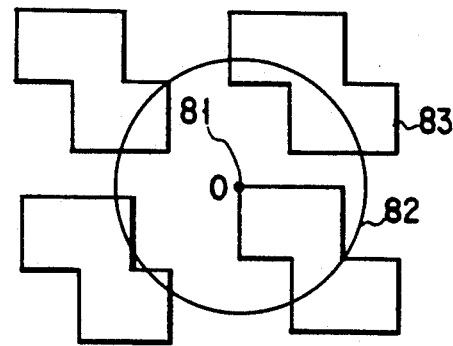
Figure 3C:
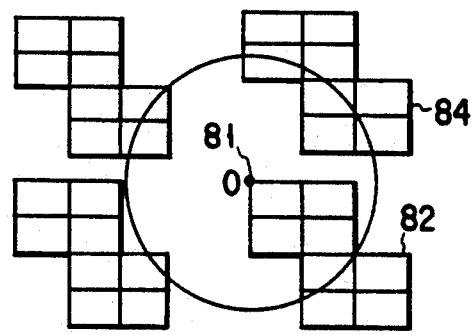
Figure 4:
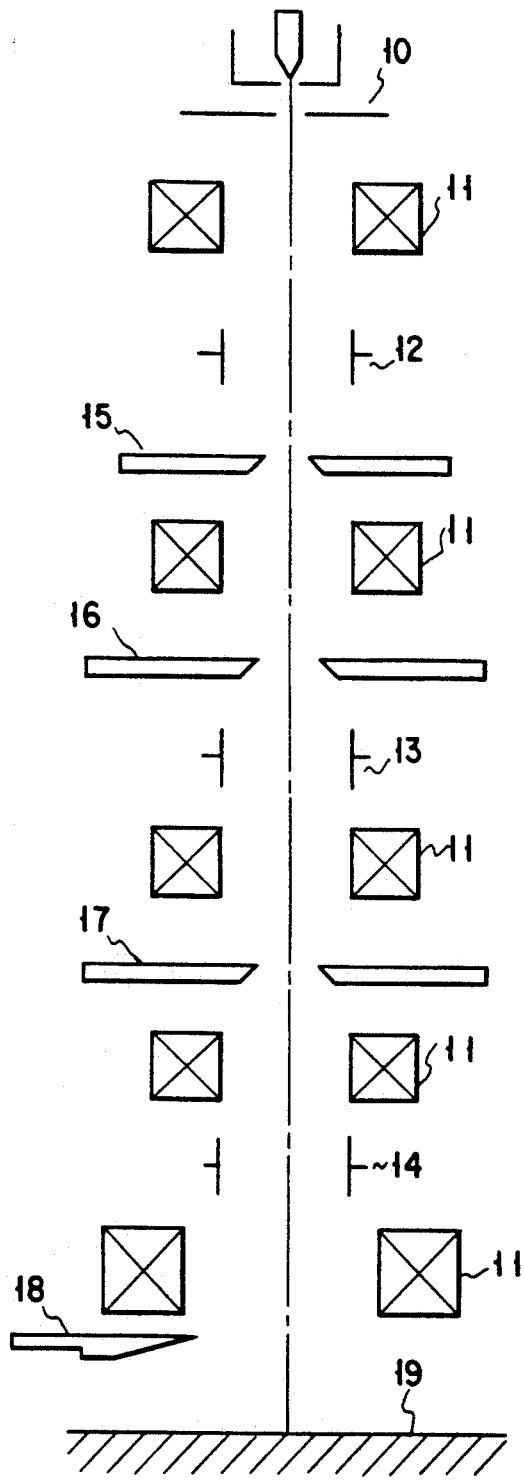
FIG. 4 illustrates an optical system of an electron beam lithography apparatus of the present invention.

FIG. 4 shows a first embodiment of an optical system of an electron beam lithography apparatus of the present invention. Referring now to FIG. 4, the electron beam lithography apparatus comprises an electron gun 10, various lens systems 11, various deflection systems 12, 13, and 14, a blanking plate 15, beam shaping aperture masks 16 and 17, reflected electron detector 18, and a target 19. An electron beam emitted from the electron gun 10 is switched on and off by the blanking deflector 12. With the present apparatus, at this time, the dose is permitted to vary with the position of irradiation by regulating the exposure time (the blanking time of the blanking deflector 12).

By the deflector 13 and the aperture masks 16 and 17, the beam transmitted through the blanking plate 15 is shaped into a rectangular beam that is rectangular in sectional shape, the dimensions of the rectangle being variable. The shaped beam is deflected by the scanning deflector 14 to scan the target 19, so that a desired pattern is drawn on the target 19.

The electron beam accelerating voltage of the apparatus of the present embodiment is 50 kV, and the variable shaped beam that can be generated is a rectangular beam which is a maximum of 2 $\mu$m height and 2 $\mu$m wide. The apparatus can produce not only a rectangular beam but also a triangular beam.

Figure 5:
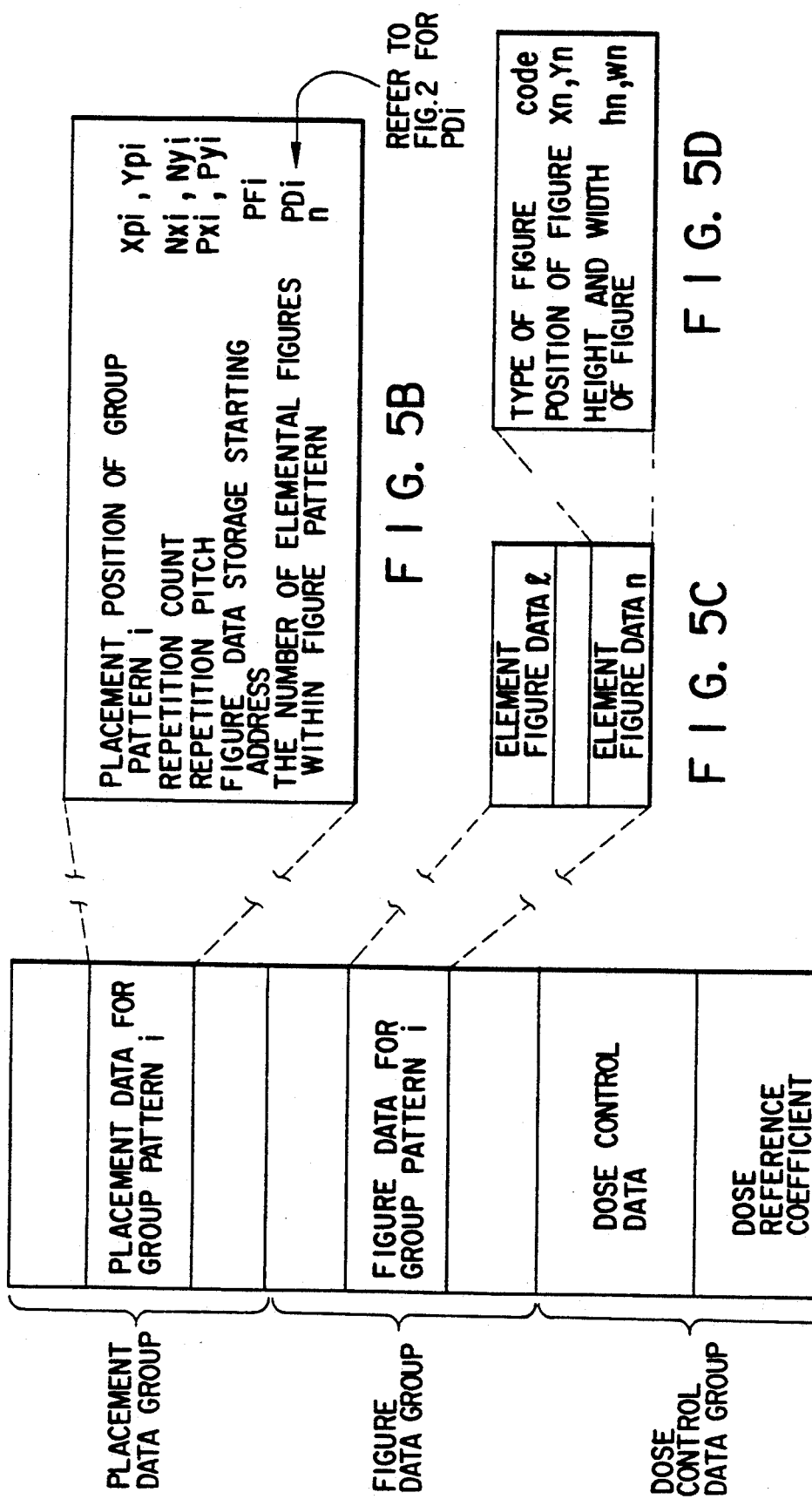
FIG. 5a-5d illustrates the construction of drawing data in accordance with a first embodiment.

FIG. 5 illustrates one example of drawing data transferred to a drawing data memory in a drawing controller incorporated into the present apparatus. The drawing data comprises a placement data group, a figure data group, and a dose control data group.

The placement data group is placement information for a group of figure data forming a specific pattern called a group pattern.

The figure data represents an element of elemental figures constructing a pattern to be drawn and includes information about the position of the pattern relative to the origin of placement of the group pattern and its shape. Further, structural features of the drawing data are that different placement data can also refer to the same group pattern, and the same group pattern can also be placed in different coordinates.

The dose control data group comprises dose control data that sets a dose control value for each of small areas, which are obtained by dividing a drawing area into areas much smaller than the broadening of backscattering of electrons, and a dose control reference coefficient. At the time of actual drawing by the use of an electron beam, the dose is set after referring to the dose control data. The dose was calculated from an approximate formula for optimum dose (refer to Journal of Applied Physics, p 4428, 11[1989]). The size of a dose setting area was chosen to be 2 $\mu$m $\times$ 2 $\mu$m. In the case of an Si substrate and an accelerating voltage of 50 kV, the broadening $\sigma_b$ of backscattering is 10 $\mu$m. That size of the dose setting area will ensure satisfactory accuracy.

FIG. 6 is a block diagram illustrating an arrangement of the drawing controller, and the flow of drawing data leading to derivation of a unit figure from the drawing data. The drawing controller comprises a drawing data developing circuit 31, a figure division circuit 32, a dose setting circuit 3, a deflection control circuit 34, and a dose control circuit 35.

The drawing data developing circuit 31 extracts a piece of figure data indicating an elemental figure and its placement coordinates from the drawing data transferred to a drawing data memory. The figure division circuit 32, when the extracted elemental figure is larger than the unit figure, divides the elemental figure data into a group of unit figure data and adds placement coordinates to the unit figure data for subsequent transfer to the deflection control circuit 34. At the same time, the dose setting circuit 33 calculates the center-of-gravity coordinates, which is the represented point of the elemental figure, from the placement coordinates of the unit figures and the size of the elemental figure and further obtains coordinate-dependent dose control data corresponding to the center-of-gravity coordinates of the elemental figure from the dose control data group using the center-of-gravity coordinates. Subsequently, the dose control circuit 33 performs arithmetic processing on the dose control data and the dose control reference coefficient and then transfers the result of the arithmetic processing to the dose control circuit 35 as dose control data.

As can be seen from the foregoing, according to the present embodiment, each unit figure can be drawn in a predetermined position and with its dose controlled. As a result, a desired pattern can be drawn on a sample surface with high accuracy.

The application of the method of the present embodiment will check an unlimited increase in data quantity resulting from proximity effect corrections. The reason will be discussed below.

An increase in data quantity is determined by only the size $2\Delta$ of a small area and the LSI chip size L and has no concern with the complexity of the original pattern. The upper limit of the data quantity is $(L/2\Delta)2 \times d_1 \cdot d_1$ is the size of one piece of dose data, for which one byte will suffice. For example, if L = 1 cm and $2\Delta = 2$ $\mu$m, an increase in data quantity in the method of the present embodiment will be not greater than, $(10^4/2)^2 \times 1 = 25$ megabytes.

Actually, the dose data can be applied to an array representation to further check an increase in data quantity. The dose data can also be used together with a method, as will be described later, which defines dose for each elemental figure. In the following, the combined use of dose data and graphic data is not made, and the effects of the method of the present embodiment are confirmed.

The application of the method of the present invention to a DRAM will control the destruction of the data array structure in the periphery of the memory cell array. For example, if the conventional method is applied to a 256M DRAM (0.25 $\mu$m rule), the destruction of array structure will occur in an area of about 1 mm$^2$ in the memory cell array, and the data quantity will increase by 36 megabytes. In contrast, when the method of the present invention is applied, destruction of an array construction occurs only a dose data and a placement data. In addition, figures are not subdivided. Therefore, the application of the method can reduce the increase in data quantity to at most 0.3 megabytes. That is, the increase in data quantity due to proximity effect corrections is so slight to be neglected.

If the conventional method were applied to a gate array personalization layer (5 mm $\times$ 5 mm, 0.5 $\mu$m rule) for proximity effect corrections, the data quantity would become about 15 megabytes. With the method of the present embodiment, on the other hand, since figures are not subdivided to correct, the data quantity becomes as small as 8 megabytes. That is, the data compression effect becomes $\frac{1}{2}$.

According to the present embodiment, since dose is determined for each of areas smaller than the broadening of backscattering of an electron beam, independently of the shape and size of an elemental figure to be drawn, there is no need of figure division for dose setting resulting from proximity effect corrections. According to the present embodiment, therefore, an increase in the number of elemental figures can be checked. That is, the data quantity can be decreased, and permitting a considerable reduction in data transfer time. Consequently, the number of samples that are subjected to lithography process by the electron beam lithography apparatus per unit time increases, thus improving the drawing throughput.

A second embodiment of the present invention will be described with reference to FIGS. 7 and 8.

Figure 7:
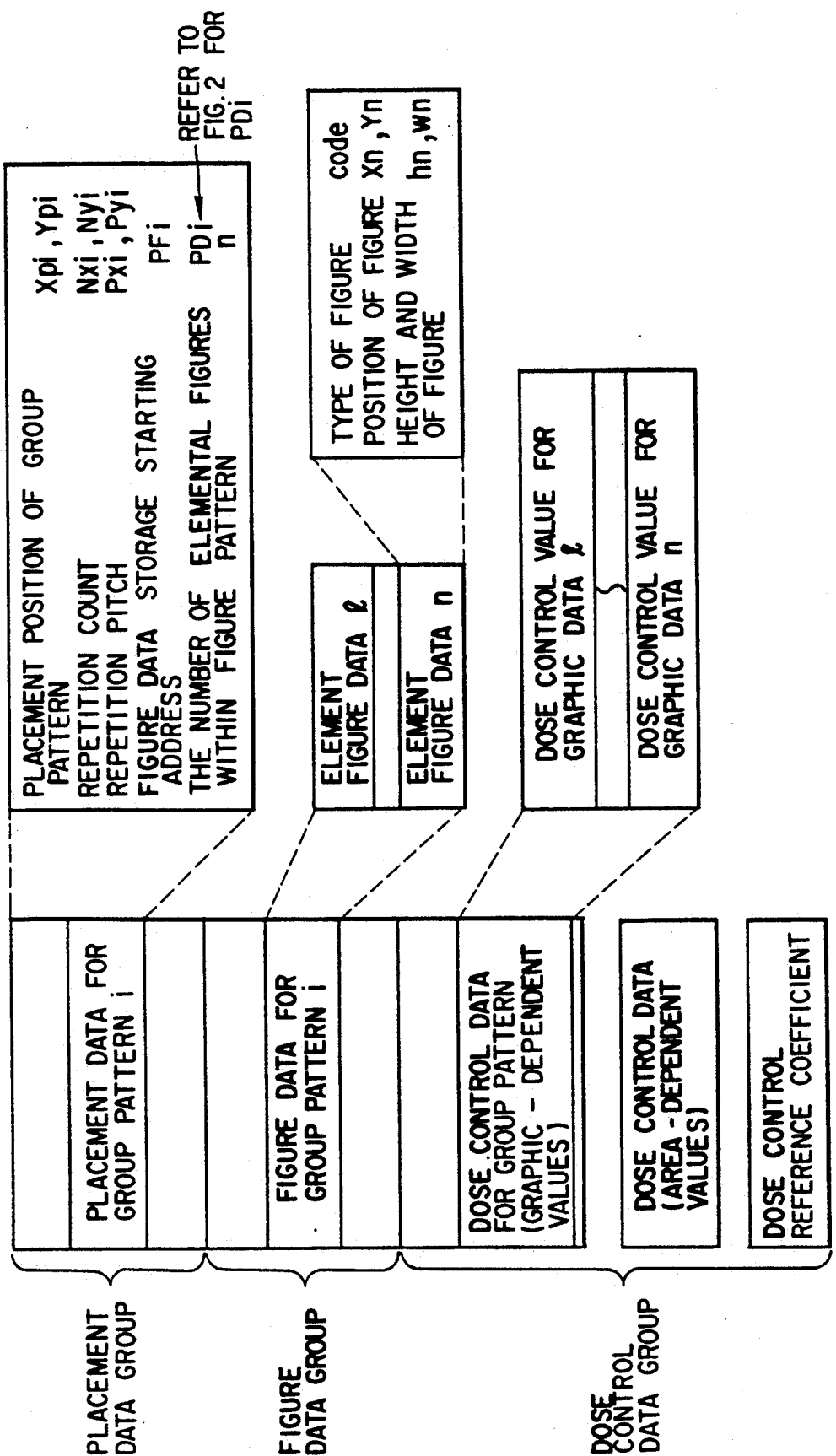
FIG. 7 illustrates the construction of drawing data in accordance with a second embodiment.

FIG. 7 illustrates one example of drawing data transferred to the drawing data memory in the drawing controller. As in the first embodiment, the drawing data comprises a placement data group, a figure data group, and a dose control data group. The second embodiment is the same as the first embodiment in the placement data group and the figure data group but differs from the first embodiment in the dose control data. In connection with the second embodiment, therefore, the description of the placement data group and the figure data group will be omitted.

The dose control data group comprises graphic-form-dependent dose control data for respective elemental figures in each group pattern, area-dependent dose control data that sets a dose control value for each of small areas, which are obtained by dividing a drawing area into areas much smaller than the broadening of backscattering of an electron beam, and a dose control reference coefficient. At the time of actual drawing by the use of an electron beam, the dose is set after referring to the graphic-form-dependent and area-dependent dose control data.

Figure 8:
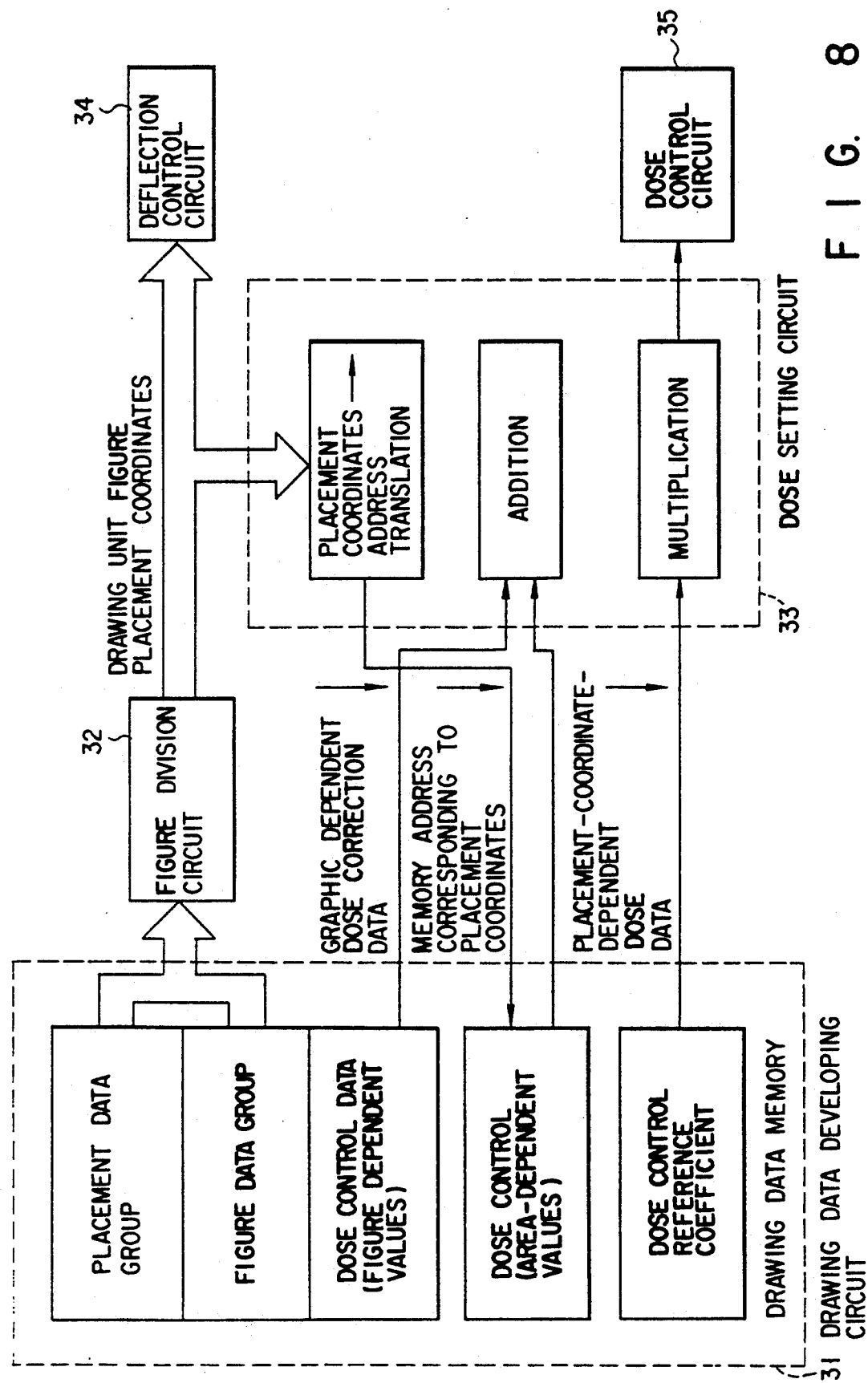
FIG. 8 is a block diagram of a drawing controller for use in the second embodiment.

FIG. 8 is a block diagram illustrating an arrangement of a drawing controller, and the flow of drawing data leading to derivation of a unit elemental figure from the drawing data. The drawing controller, as in the first embodiment, comprises a drawing data developing circuit 31, a figure division circuit 32, a dose setting circuit 33, a deflection control circuit 34, and a dose control circuit 35.

As in the first embodiment, in the second embodiment as well, the drawing data developing circuit 31 extracts one piece of figure data and its placement coordinates. The figure division circuit 32 divides elemental figure data that is larger in size than a unit figure into unit figures. Further, the figure division circuit 32 adds placement coordinates to each of the unit figures and transfers the placement coordinate data to the deflection control circuit 34.

In the present embodiment, the figure division circuit 32, simultaneously with the transfer of the placement coordinate data to the deflection control circuit 34, transfers to the dose setting circuit 33 a graphic-dependent value, in the dose control data group, corresponding to the drawing unit figure. The dose setting circuit 33 obtains, from the placement coordinates and the size of the unit figures, the center-of-gravity coordinates representing the represented point of the elemental figure and obtains corresponding coordinate-dependent dose control data from area-dependent values in the dose control data group using the center-of-gravity coordinates. Subsequently, the dose setting circuit 33 adds the graphic-dependent dose control data and the coordinate-dependent dose control data together and then performs arithmetic processing on the result of the addition and the dose control reference coefficient. Subsequently, the dose setting circuit 33 transfers the result of the arithmetic processing to the dose control circuit 35 as dose control data.

According to the present embodiment, as described above, since a unit figure can be drawn in a predetermined position and with controlled dose, a desired pattern can be formed on a sample surface. Therefore, the present embodiment can also provide the same advantages as the first embodiment. In addition, the present invention uses the method which defines dose for each of areas and the method which defines dose for each of elemental figures, thereby suppressing an increase in data quantity more than the first embodiment.

The reason why corrected dose may be set not for each of elemental figures but for each of areas that are sufficiently smaller than the broadening of backscattering of electrons will be discussed below by using a specified example.

Figure 9A:
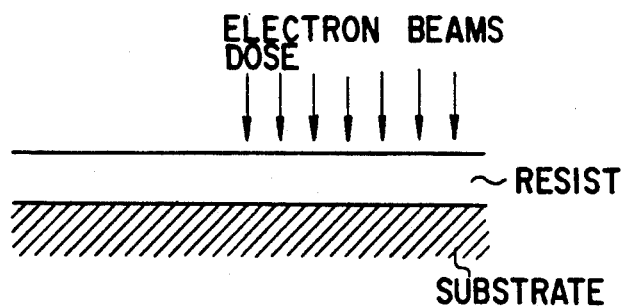
FIGS. 9A through 9C are diagrams for use in explanation of the validity of setting corrected dose for each of areas which are much smaller than the broadening of backscattering.
Figure 9B:
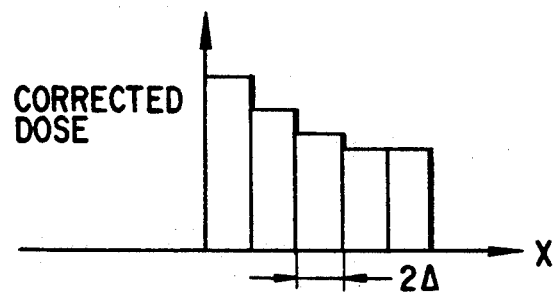
Figure 9C:
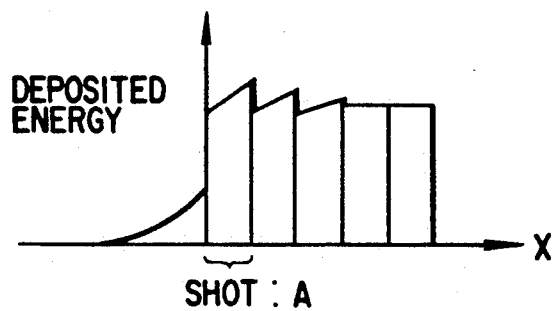
Figure 10:
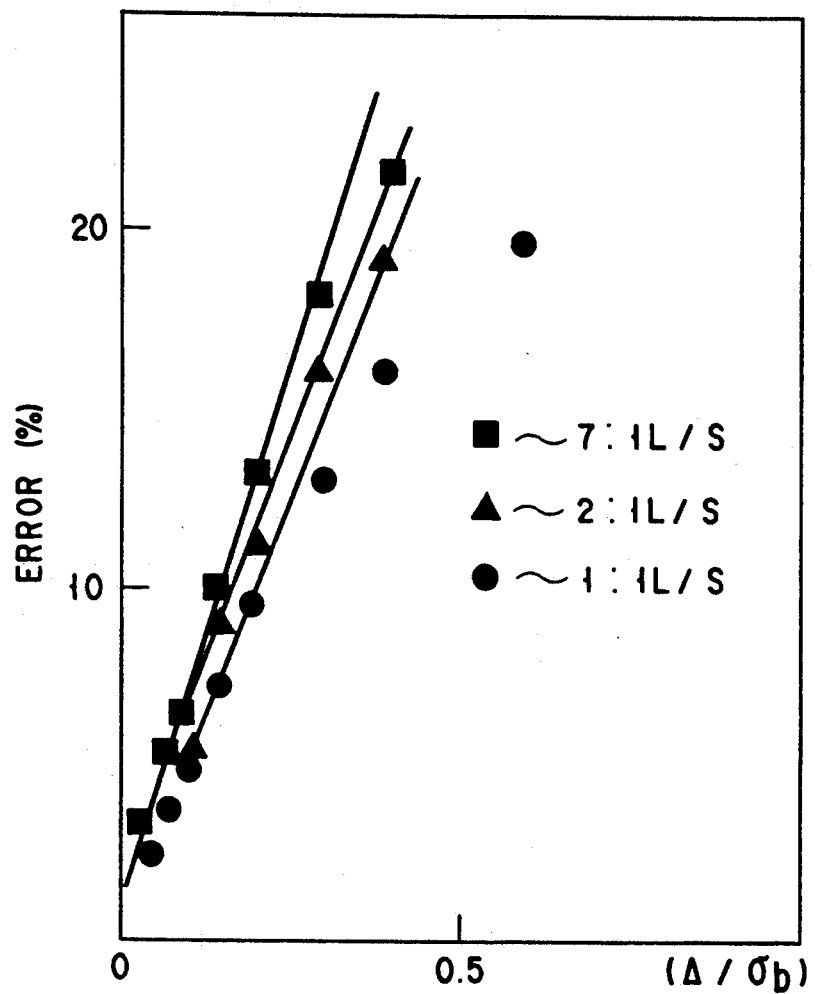
FIG. 10 is a diagram illustrating the dependence of errors of the corrected dose shown in FIGS. 9A through 9C on small area sizes.

Consider a case where, as shown in FIG. 9A, an area of $x \geq 0$ (a portion irradiated with an electron beam as shown) is subjected to corrected dose. As shown in FIG. 9B, the dose is constant within a small area ($2\Delta$ in size). In this case, as shown in FIG. 9C, energy stored in the resist is varied within a small area by the influence of backscattering. The variation is a maximum at the edge of the portion irradiated with the electron beam. FIG. 10 illustrates the dependence of such variation (i.e., error) on the size of small areas. Such dependence was confirmed by the following numerical calculations.

A pattern to be drawn was divided into areas $2\Delta$. Corrected dose was determined for the center of gravity of each small area. The algorithm for correction used herein is the method by M. Parikh, "Correction to Proximity Effects in Electron Beam Lithography (I. Theory; pp. 4371, II. Implementation; pp. 4378 and III. Experiments; pp. 4383)", J. Appl. Phys. 50(6). June 1979.

In this case, deposited energy is estimated for line-to-space ratios of 1:1, 1:2, 1:7, 2:1, and 7:1 in arbitrary positions on the resist in the case where optimum dose is set for pattern in each small area. Next, a variation in stored energy within a small area, which is a deviation from a constant value of deposited energy in the center-of-gravity position, is estimated as an error.

The quantity of deposited energy in an arbitrary position on the resist is expressed by:

$$E(x) = \sum_i \int D_i \cdot \left\{ \delta(x - x') + \frac{\eta_e}{\pi \sigma_b^2} \exp\left( -\frac{(x - x')^2}{\sigma_b^2} \right) \right\} \quad (5)$$

Where $D_i$ is the optimum does set for the center of gravity of the pattern in the i-th area, $\eta_e$ is the ratio of dose due to forward scattering to dose due to backscattering, and $\sigma_b$ is the broadening of backscattering.

Errors estimated from calculations by equation (5) are shown in FIG. 10. FIG. 10 shows the maximum variation in deposited energy in areas in which the same dose is set. From FIG. 10 it will be seen that, if $\Delta/\sigma_b$ is on the order of 1/10, the error can be kept at about 2% at most.

For example, in the case of an accelerating voltage of 50 kV and an Si substrate, since $\sigma_b = 10$ μm and if $\Delta = 1$ μm (i.e., the area size $2\Delta = 2$ μm), the error is small, 2% at most. That is, it will be seen from FIG. 10 that no problem arises from setting of the same corrected dose for areas much smaller in size than the broadening of backscattering.

The present invention need not be limited to the embodiments described above. The electronic optical system is not limited to the arrangement shown in FIG. 4 but may be modified according to specifications. For example, the present invention may be applied to an ion beam lithography apparatus that uses an ion beam in place of an electron beam. It is apparent that other embodiments and modifications are possible.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A charged particle lithography method of drawing a desired pattern on a sample by irradiating the sample with a charged particle beam, comprising the steps of:
    the first step of storing, in a memory, the following independent three data:
    (1) first figure data representing the shape of at least one elemental figure constructing a desired pattern,
    (2) placement data representing the position in which the figure data is to be placed, and
    (3) dose control data containing either dose for each of small areas when at least part of a drawing area is divided into areas smaller than the broadening of backscattering of a charged particle beam or reference data for calculating dose;
    the second step of dividing a second figure data to be drawn into unit figures each having a predetermined shape and smaller than a predetermined size on the basis of said first figure data;
    the third step of calculating a represented point of each of the unit figures in referring to said placement data;
    the fourth step of obtaining a quantity of radiation of the charged particle beam from said dose control data set for the small area to which the represented point calculated by the third step belongs; and the fifth step of determining the dose of the charged particle beam obtained by the fourth step as dose for the unit figure.

2. The method according to claim 1, wherein the first step includes the step of storing the placement data containing information about shapes and placement positions of the small areas relative to the placement origin of a group of the figure data corresponding to the drawing area.

3. The method according to claim 1, wherein the first step includes the step of storing the dose control data containing dose data for the small areas and a dose control reference coefficient.

4. The method according to claim 3, wherein the fourth step includes the step of setting a dose of the charged particle beam by multiplication of the dose data for the small areas and the dose control reference coefficient.

5. The method according to claim 1, wherein the third step includes the step of setting the represented points as center-of-gravity coordinates of the unit figures.

6. The method according to claim 1, wherein the first step includes the step of describing the dose control data containing first dose data dependent on a predetermined figure, second dose data for controlling the dose for the area, and dose control reference data.

7. The method according to claim 6, wherein the fourth step includes the step of obtaining dose by adding the first dose data and the second dose data and then multiplying the result of the addition and the dose control reference data.

8. A charged particle lithography apparatus for drawing a desired pattern on a sample by irradiating the sample with a charged particle beam, comprising
    means for storing the following independent three data;
    (1) figure data representing the shape of at least one elemental figure constructing a pattern to be drawn,
    (2) placement data representing the position in which the figure data is to be placed, and
    (3) dose control data representing dose for each of areas which are obtained by dividing a drawing area which are smaller than the broadening of backscattering of a charged particle beam;
    means for generating a unit figure from said figure data and placement data, in which the position of the unit figure is to be drawn is determined from said figure data and said placement data and the size of the unit figure to be drawn is determined from said figure data;
    means for determining a represented position of the unit figure according to its size determined by said unit figure generating means and determining coordinates of the represented point of the unit figure from said position of the unit figure; and
    means for determining dose of the unit figure from the coordinates of the represented point of the unit figure determined by said coordinate determining means and said dose control data.

9. The apparatus according to claim 8, wherein the dose control data contains dose data dependent on elemental figures in the figure data.

* * * * *

UNITED STATES PATENT AND TRADEMARK OFFICE
CERTIFICATE OF CORRECTION

PATENT NO. : 5,305,225
DATED : April 19, 1994
INVENTOR(S) : Toshio YAMAGUCHI, et al.

It is certified that error appears in the above-indentified patent and that said Letters Patent is hereby corrected as shown below:

On the title page, Item [30], the 2nd Foreign Application Priority Data has been omitted and should read as follows:

--Apr. 14, 1992 [JP]  Japan ................. 4-94269--

Also, on the title page, Item [54] and Column 1, Line 2, in the title, "Litography" should read --LITHOGRAPHY--.

Signed and Sealed this

Twenty-sixth Day of July, 1994

Attest:

BRUCE LEHMAN

*Attesting Officer*     *Commissioner of Patents and Trademarks*